United States Patent [19]
Wilkinson

[11] Patent Number: 5,900,974
[45] Date of Patent: May 4, 1999

[54] BACKING PLATE FOR CONTRAST ENHANCEMENT OF PHOTOLITHOGRAPHIC IMAGES ON TRANSPARENT SUBSTRATES AND METHOD OF USING SAME

[75] Inventor: Dean Wilkinson, Boise, Id.

[73] Assignee: Micron Technology, Inc., Boise, Id.

[21] Appl. No.: 08/795,053

[22] Filed: Feb. 5, 1997

[51] Int. Cl.[6] .............................. G03B 27/72; G02B 5/30
[52] U.S. Cl. ................... 359/493; 359/497; 359/501; 359/485; 355/71
[58] Field of Search .................................. 359/483, 485, 359/493, 497, 501, 601, 614, 900; 355/71

[56] References Cited

U.S. PATENT DOCUMENTS

| | | |
|---|---|---|
| 4,972,224 | 11/1990 | Thompson ................................. 355/71 |
| 5,049,927 | 9/1991 | Tsushima et al. ......................... 355/71 |
| 5,300,972 | 4/1994 | Kamon ..................................... 355/71 |
| 5,442,184 | 8/1995 | Palmer et al. ............................ 355/71 |

*Primary Examiner*—Cassandra C. Spyrou
*Assistant Examiner*—John Juba, Jr.
*Attorney, Agent, or Firm*—Seed and Berry LLP

[57] ABSTRACT

A backing plate for a transparent substrate constructed of two polarizer sheets. The axes of polarization of the polarizer sheets are substantially orthogonal to each other. The backing plate thus absorbs more than 98% of incident light and prevents substantial reflection. The backing plate is especially adapted for use with a transparent substrate undergoing any photolithographic process.

32 Claims, 3 Drawing Sheets

BACKING PLATE FOR CONTRAST ENHANCEMENT OF PHOTOLITHOGRAPHIC IMAGES ON TRANSPARENT SUBSTRATES AND METHOD OF USING SAME

This invention was made with Government support under Contract No. DABT63-93-C-0025 awarded by Advanced Research Projects Agency (ARPA). The Government has certain rights in this invention.

TECHNICAL FIELD

This invention relates to photolithography, and more particularly, to a high contrast low reflectivity backing plate for a transparent substrate undergoing a photolithographic process.

BACKGROUND OF THE INVENTION

Most integrated circuits are fabricated using photolithographic methods. An exemplary procedure is illustrated by the following steps. A silicon substrate is covered by a layer of a light sensitive coating, usually positive photoresist. Photoresist is a light sensitive material that polymerizes or de-polymerizes, or in other words changes chemically, when it is exposed to light. Positive photoresist de-polymerized by light is soluble in a particular solvent and can be washed away. Positive photoresist masked from light remains polymerized and is thus insoluble in the solvent and cannot be washed away. Negative photoresist polymerized by light is insoluble in the solvent and cannot be washed away. Negative photoresist that is masked from light remains unpolymerized and can thus be washed away, leaving the polymerized photoresist in the shape of the negative of the original mask pattern.

Using positive photoresist as an example, an integrated circuit is fabricated by placing a transparent mask having an opaque mask pattern on its lower surface on top of the positive photoresist. After the silicon substrate has been covered by the photoresist and the mask, the photoresist and the mask are exposed to incident light which de-polymerizes the exposed photoresist. The de-polymerized positive photoresist is then washed away leaving the polymerized photoresist in the shape of the original mask pattern. Washing away the de-polymerized positive photoresist exposes the silicon substrate over areas outside the mask pattern. As a result, the silicon is exposed for such semiconductor processes as doping, material deposition, etching, ion implantation, oxidation, etc. The areas covered by the polymerized positive photoresist are shielded from these processes. The quality of the circuit resulting from this procedure depends upon the precision and resolution of the pattern of polymerized photoresist.

The quality of the pattern produced in the photoresist by the procedure described above degrades if directly reflected or diffuse reflected light polymerizes the photoresist in areas under the mask pattern. Improperly polymerized positive photoresist is washed away to expose areas of the substrate that should be covered. The problem is illustrated in FIGS. 1A and 1B. With reference to FIG. 1A, a layer of positive photoresist 10 coats the surface of a silicon substrate 12. A transparent mask 14 having an opaque mask pattern 16 formed on its lower surface is placed on the coating of photoresist 10. The mask pattern 16 is typically a very thin layer of chromium bonded to the surface of the transparent mask 14. With reference to FIG. 1B, the transparent mask 14 is exposed to incident light 18. Unwanted exposure of the coating of photoresist 10 can occur where rays of the incident light 18 pass through the coating of photoresist 10 (photoresist is generally transparent) and reflect from the surface of the silicon substrate 12. The incident light 18 reflecting from the surface of the silicon substrate 12 exposes the coating of photoresist 10 under the mask pattern 16, thereby causing the edges of the exposed portion of the coating of photoresist 10 to be indistinct or fuzzy. However, since the silicon substrate 12 is opaque, the incident light 18 reflecting from the upper surface of the silicon substrate 12 travels through only the coating of photoresist 10 before being reflected upward. Since the coating of photoresist 10 is relatively thin, the transverse distance traveled by the incident light 18 reflecting from the surface of the silicon substrate 12 is relatively short. Therefore, the reflected portion of the incident light 18 does not travel far enough in a transverse direction to affect more than a narrow fringe of the coating of photoresist 10 under the edges of the mask pattern 16. This small amount of excess polymerization does not substantially impair the resulting circuit.

Although the transverse shift of incident light does not present a significant problem for photolithography on an opaque silicon substrate, it does cause problems for photolithography on a transparent substrate. With reference to FIG. 2A, a coating of photoresist 20 covers the upper surface of a transparent substrate 22 that is supported by a backing plate 24. A transparent mask 26 having an opaque mask pattern 28 formed on its lower surface is placed over the coating of photoresist 20. With reference to FIG. 2B, the transparent mask 26 is exposed to incident light 30. The incident light 30 passes through the transparent mask 26, the coating of photoresist 20, and the transparent substrate 22, and is incident on the surface of the backing plate 24. Unfortunately, some of the incident light 30 reflects from the surface of the backing plate 24. Since the transparent substrate 22 may be substantially thicker than the coating of photoresist 20, the transverse distance traveled by the portion of the incident light 30 reflecting from the backing plate 24 may be substantial. As a result, when a photolithographic procedure is performed on a conventional transparent substrate, significant areas of the coating of photoresist 20 under the mask pattern 28 may be exposed. The reflecting portion of the incident light 30 exposing areas of the coating of photoresist 20 under the mask pattern 28 may be either non-diffuse light reflecting from the backing plate 24 having a smooth surface or diffuse light which reflects from the backing plate 24 having either an irregular surface or foreign particles or film on its surface.

In theory, purely columnar incident light does not present the problem described above because the columnar incident light reflects directly from the backing plate 24, and thus exits the coating of photoresist 20 over the same area that it entered. However, most incident light is not purely columnar and has transverse components. Also, as mentioned above, an irregular or dirty surface on the backing plate 24 may also diffuse purely columnar light back toward the masked portions of the coating of photoresist 20.

Several solutions to this problem mitigate but do not eliminate the reflection of light toward the masked portions of the coating of photoresist 20. Anodized aluminum or other darkened surfaces can be used on a light-absorbing backing plate 24 for transparent substrates. However, such surfaces do not absorb 100% of incident light. As a result, even dark surfaces reflect some incident light 30 back toward the masked portions of the coating of photoresist 20.

Attempts have also been made to solve the above-described problem by using columnar light and a backing plate 24 having a mirrored surface. However, as mentioned above, foreign matter such as particles or film inevitably contaminate the surface of the mirrored backing plate 24 and diffuse incident light toward the masked portions of the coating of photoresist 20. Any irregularities on the surface of the mirror would also reflect diffuse light toward the masked portions of the coating of photoresist 20. Finally, as mentioned above, the incident light 30 is generally not purely columnar and has transverse components as it reflects from the mirrored backing plate 24. As a result, such a mirrored surface on the backing plate 24 may exacerbate the problem of an improper polymerization of the masked portions of the coating of photoresist 20.

Although most photolithography is accomplished by placing a mask pattern over a coating of photoresist on a substrate and exposing the mask pattern to a source of incident light, a similar light pattern may also be generated directly by a projection printer. A projection printer projects a light pattern onto the coating of photoresist. This method results in the same kind of problems described above with respect to photolithography using a mask. With reference to FIG. 3, a transparent substrate 32 is positioned on a mirrored backing plate 34, and is covered with a coating of photoresist 36. Incident light 38 is projected from a projection printer 40 onto the coating of photoresist 36. The incident light 38 propagates through the coating of photoresist 36 and through the transparent substrate 32 to reflect off of the mirrored backing plate 34. Projection printers generally use light that is not perfectly columnar, as shown by the numeral 38 in FIG. 3, and therefore the reflections from the mirrored backing plate 34 travel a substantial transverse distance from the original incidence. Also, of course, even if the projected light was columnar, it would still be diffused by dirt, film, or other foreign matter on the surface of the mirrored backing plate 34. As a result, the reflected light from the projection printer produces fuzzy or indistinct edges in the resulting photoresist pattern.

The above-described procedures have been explained with reference to a positive photoresist in which the area of the photoresist exposed to the incident light becomes soluble in solvent as mentioned above. However, the discussion is equally applicable to the use of a negative photoresist in which the area of the photoresist exposed to the incident light becomes insoluble. As a result, the areas of negative photoresist corresponding to the mask pattern remain soluble and are washed away, leaving the silicon exposed in the shape of the mask pattern.

SUMMARY OF THE INVENTION

The inventive backing plate is used for absorbing incident light generated by a patterned light generator which is transmitted through a light sensitive coating on a transparent substrate. The backing plate is constructed from a pair of polarizer sheets, each of which has a respective axis of polarization. The polarizer sheets are oriented so that their axes of polarization are substantially orthogonal to each other, thereby causing the backing plate to absorb the incident light passing through the light sensitive coating and the transparent substrate.

The top of the backing plate may be covered by an anti-glare coating. The backing plate may also be index matched with the transparent substrate. The top surface of the backing plate may be coated by an index of refraction matching fluid.

The inventive backing plate may be included in a photolithographic processing system which has a transparent substrate with a light sensitive coating on a first side of the transparent substrate and the backing plate positioned proximate to a second side of the substrate, the second side being opposite to the first side. The backing plate is constructed of a pair of polarizer sheets as described above and therefore absorbs incident light generated by a patterned light generator, the incident light passing through the light sensitive coating and the transparent substrate. The backing plate may be in contact with the transparent substrate, and the backing plate may support the transparent substrate. Also, the backing plate may be held in contact with the transparent substrate by a vacuum chuck. Alternatively, there may be a gap between the backing plate and the transparent substrate. The patterned light generator may be made up of a mask and a light source or it may be a projection printer.

The inventive method is made up of the following steps. A light sensitive coating is deposited on one surface of a transparent substrate. A backing plate made up of a pair of polarizer sheets is positioned proximate to the opposite surface of the transparent substrate. Finally, the light sensitive coating is exposed to a pattern of incident light generated by a patterned light generator. The pattern of incident light passes through the light sensitive coating and light transmissive substrate and is absorbed by the backing plate.

DETAILED DESCRIPTION OF THE INVENTION

Figure 1A:
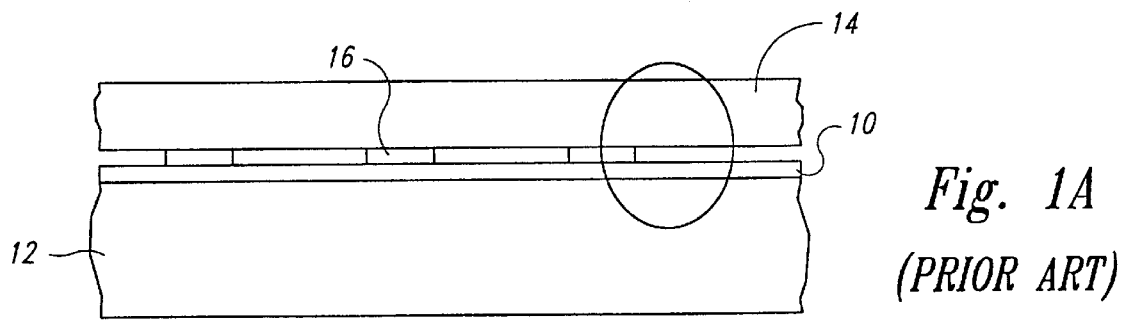
FIG. 1A is a cross-sectional view illustrating a conventional photolithography process in which a mask is positioned over a silicon substrate coated with a layer of a photoresist.
Figure 1B:
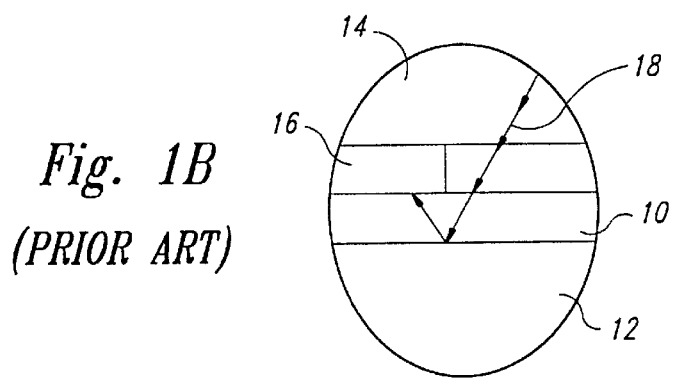
FIG. 1B is a cross-sectional view of a portion of FIG. 1A showing the propagation of incident light through the mask and the photoresist coating.
Figure 2A:
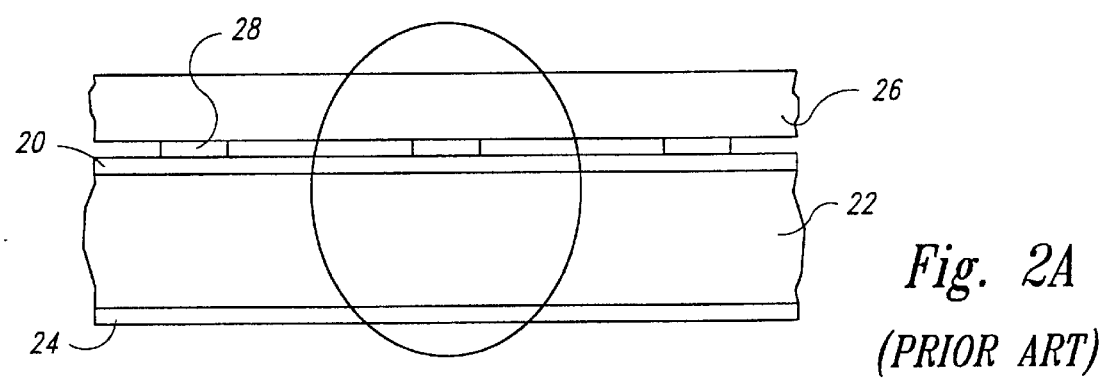
FIG. 2A is a cross-sectional view of a conventional photolithography process in which a mask is positioned over a transparent substrate which is coated with a layer of photoresist and supported by a backing plate.
Figure 2B:
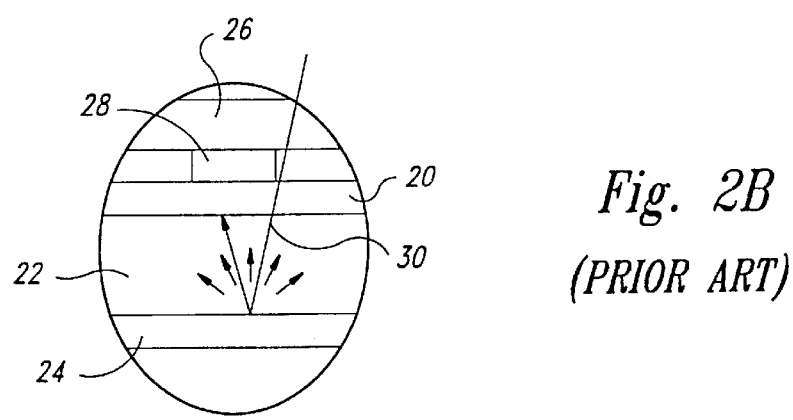
FIG. 2B is a cross-sectional view of a portion of FIG. 2A showing the propagation of incident light through the mask, the photoresist coating, and the transparent substrate, and reflecting from the backing plate.
Figure 3:
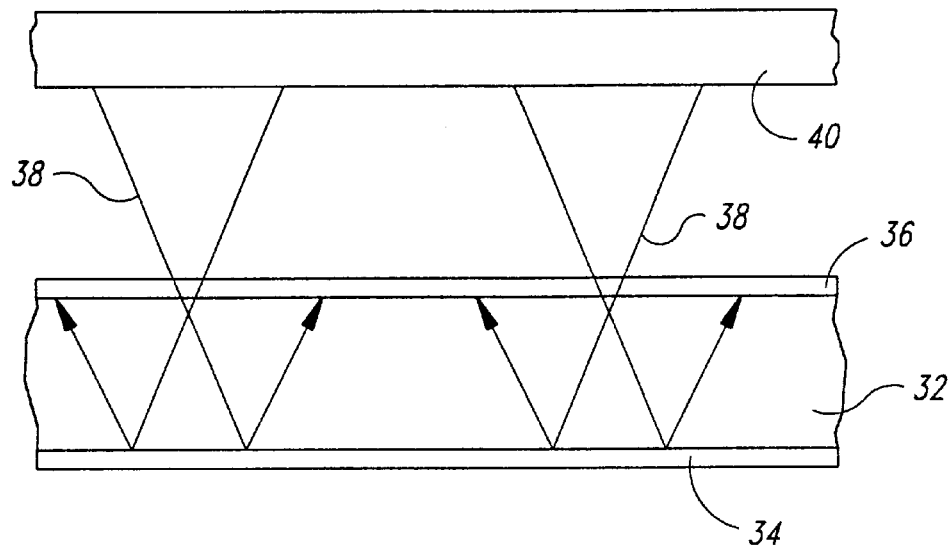
FIG. 3 is a cross-sectional view showing a conventional projection printer projecting a pattern of light through a coating of photoresist and a transparent substrate and onto a mirrored backing plate.
Figure 4:
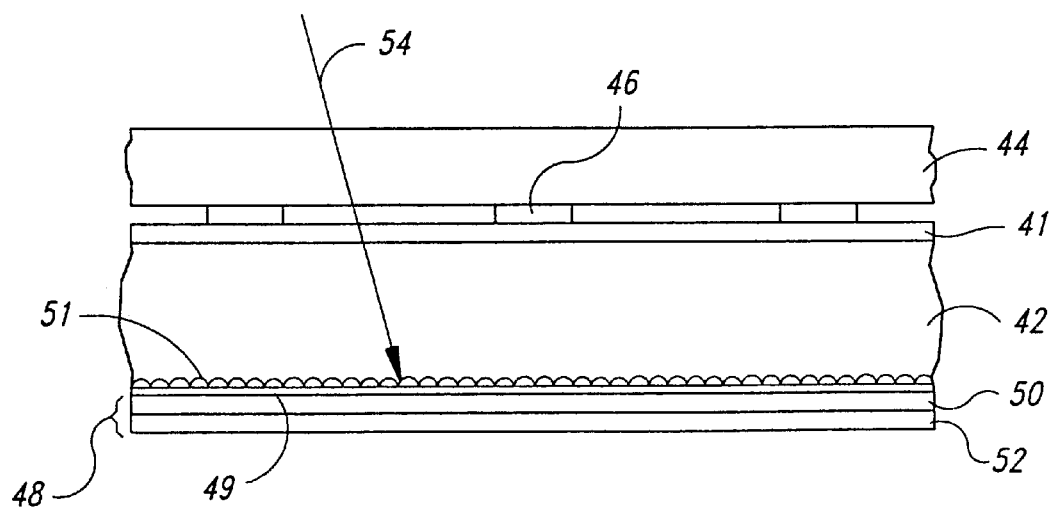
FIG. 4 is a cross-sectional view of a photolithography process in which a mask is positioned over a transparent substrate coated with a layer of a photoresist, in which the transparent substrate is positioned on a backing plate according to a preferred embodiment of the invention.

A preferred embodiment of the invention is shown in FIG. 4. With reference to FIG. 4, a layer of photoresist 41 coats the upper surface of a transparent substrate 42. The transparent substrate 42 is made of a transparent material, typically glass. A mask 44 is placed on top of the coating of photoresist 41. The mask 44 is constructed of a transparent material having an opaque mask pattern 46 formed on its lower surface. Usually the mask 44 is quartz or glass, and the mask pattern 46 is made of chromium. The transparent substrate 42 is placed on top of a backing plate 48 fabricated according to a preferred embodiment of the invention. The backing plate 48 is constructed of two conventional polarizer sheets, an upper polarizer sheet 50 and a lower polarizer sheet 52. The polarizer sheets 50 and 52 are in contact with each other. Each of the polarizer sheets 50, 52 has a respective axis of polarization that allows light waves to pass only if they are aligned with the axis of polarization. The polarizer sheets 50 and 52 are oriented such that the axis of polarization of the upper polarizer sheet 50 is substantially orthogonal to the axis of polarization of the lower polarizer sheet 52.

The polarizer sheets 50, 52 are placed below the transparent substrate 42 so that incident light 54 passing through the coating of photoresist 41 and the transparent substrate 42 is first incident on the upper polarizer sheet 50. The upper polarizer sheet 50 absorbs most of the waves of the incident light 54 that are not aligned with the axis of polarization of the upper polarizer sheet 50. The light waves substantially aligned with the axis of polarization of the upper polarizer sheet 50 pass through the upper polarizer sheet 50 and are incident on the lower polarizer sheet 52. Since the axis of polarization of the lower polarizer sheet 52 is substantially orthogonal to the axis of polarization of the upper polarizer sheet 50, virtually none of the incident light waves passing through the upper polarizer sheet 50 are aligned with the axis of polarization of the lower polarizer sheet 52. As a result, virtually all of the light that is not absorbed by the upper polarizer sheet 50 is absorbed by the lower polarizer sheet 52. In the preferred embodiment, at least 98% of the light incident on the polarizer sheets 50, 52 is absorbed.

In use, as illustrated in FIG. 4, the mask 44 is exposed to the incident light 54. The incident light 54 that passes through the mask 44, the coating of photoresist 41, and the transparent substrate 42 is almost fully absorbed by the polarizer sheets 50, 52. As a result, there is virtually no reflecting light to expose portions of the coating of photoresist 41 covered by the mask pattern 46. Therefore, the incident light 54 exposes only the coating of photoresist 41 around the mask pattern 46, as described above. In the preferred embodiment, the polarizer sheets 50 and 52 absorb more than 98% of the light passing through the transparent substrate 42. Diffuse reflectivity from the polarizer sheets 50, 52 is typically less than 0.2% which provides a photolithographic image contrast ratio in excess of 500 to 1.

The polarizer sheets 50 and 52 are typically fabricated in film. In the preferred embodiment a pair of such films are sandwiched between two sheets of glass (not shown). However, the polarizer sheets 50, 52 may also be fabricated by other conventional means. Also, of course, two sheets of polarizing film having respective axes of polarization oriented at 90 degrees to each other may be positioned adjacent to each other and sandwiched between the same two sheets of glass (not shown).

The transparent substrate 42 may be in contact with the backing plate 48 so that it is structurally supported by the backing plate 48. However, the transparent substrate 42 may also be supported above, and thus spaced apart from, the backing plate 48. An anti-glare coating 49, shown in FIG. 4, may be applied to the top of the backing plate 48 to reduce the possibility of any reflection from the upper surface of the backing plate 48. Also, the transparent substrate 42 may be index matched with the backing plate 48 by filling any gap that may exist between the transparent substrate 42 and the backing plate 48 with an index of refraction-matching fluid 51, shown in FIG. 4.

Figure 5:
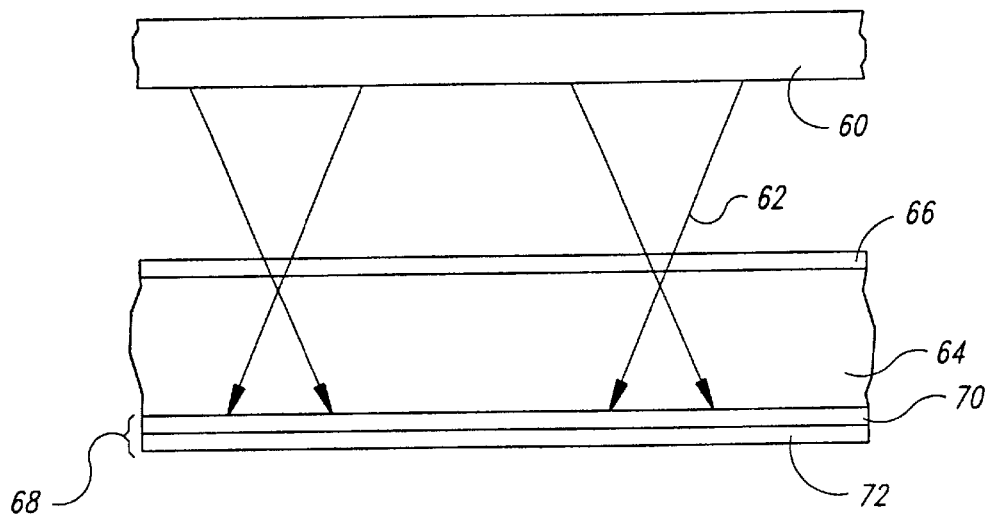
FIG. 5 is a cross-sectional view of a photolithography process in which a projection printer projects a pattern of light through a layer of photoresist and a transparent substrate onto a backing plate according to a preferred embodiment of the invention.

The preferred embodiment may be used with a projection printer in lieu of a mask and a light source. With reference to FIG. 5, a projection printer 60 projects an incident light pattern 62 onto a transparent substrate 64 that is covered with a coating of photoresist 66. The incident light pattern 62 passes through the coating of photoresist 66, and the transparent substrate 64, and is incident on a backing plate 68. The backing plate 68, like the backing plate 48 of FIG. 4, is comprised of two polarizer sheets 70 and 72, which are oriented orthogonal to each other and function as explained above.

Figure 6:
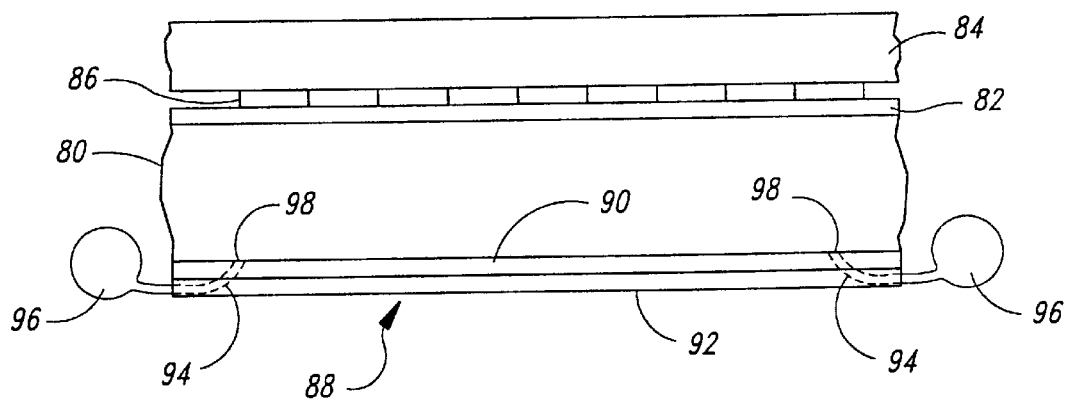
FIG. 6 is a cross-sectional view of a photolithography process in which a mask is positioned over a transparent substrate coated with a layer of a photoresist, in which the transparent substrate is positioned on a backing plate having a vacuum chuck according to a preferred embodiment in the invention.

The substrate may be secured to the backing plate by means of a vacuum chuck, as shown in FIG. 6. As in the embodiment of FIG. 4, a transparent substrate 80 has a coating of photoresist 82, and a mask 84, having an opaque mask pattern 86 formed on its lower surface, is placed on top of the coating of photoresist 82. The transparent substrate 80 is placed on a backing plate 88. The backing plate 88 is constructed of two polarizer sheets 90 and 92 oriented such that their respective axes of polarization are substantially orthogonal to each other. Both polarizer sheets 90 and 92 have formed therein vacuum conduits 94 which communicate with a vacuum source 96. The conduits 94 are open at respective vacuum ports 98 so that a vacuum is applied to the underside of the transparent substrate 80. The vacuum draws the transparent substrate 80 against the backing plate 88 thereby releasably securing the transparent substrate 80 to the backing plate 88.

The backing plate comprised of two polarizer sheets disclosed herein may be employed in the manufacture of many types of devices having transparent substrates on which photolithographic procedures are used. Examples of such devices are liquid crystal displays ("LCDs"), active matrix LCDs, baseplates for field emission displays ("FEDs"), and faceplates for FEDs and cathode ray tubes ("CRTs").

Other advantages of the preferred embodiment are an increased feature sharpness in photoresist patterns and a larger range of exposure times. The light sensitive coating in the preferred embodiment may be exposed to incident light longer because no significant reflection is returning from the polarizer sheets in the backing plate to degrade the photoresist pattern. The exposure is also less sensitive to variations in light source intensity across the surface of the substrate for the same reason. The absence of substantial reflected light in the exposure makes the edges of the exposed photoresist sharper and more distinct and reduces sloping of the edges which improves the quality of the features created by the masking.

It will be recognized by those of ordinary skill in the art that the terms "top" and "bottom" describe one orientation of the embodiments of the novel backing plate described herein. More generally, the transparent substrate is positioned between the backing plate and the source of incident light.

The photolithographic processes described above include the step of projecting a pattern of light onto a layer of photoresist to expose an area of the photoresist corresponding to the pattern. The description includes references to a projection printer and a mask combined with a source of incident light. Each of these structures are capable of producing the pattern of incident light. Both structures may be identified generally as patterned light generators.

While various embodiments have been described in this application for illustrative purposes, the claims are not so limited. Rather, any equivalent method or device operating according to principles of the invention falls within the scope thereof.

What is claimed is:

1. A backing plate for absorbing incident light generated by a patterned light generator, the incident light being transmitted through a light sensitive coating and a transparent substrate onto the backing plate, the backing plate comprising a pair of polarizer sheets, each of which has a respective axis of polarization, the polarizer sheets being oriented so that the axes of polarization of the polarizer sheets are oriented substantially orthogonal to each other, thereby causing the backing plate to absorb the incident light passing through the light sensitive coating and the transparent substrate.

2. The backing plate of claim 1, further comprising an index of refraction matching fluid coating on a surface of the backing plate facing the transparent substrate.

3. The backing plate of claim 1 wherein the backing plate is index matched with the transparent substrate.

4. The backing plate of claim 1, further comprising an anti-glare coating covering a surface of the backing plate facing the transparent substrate.

5. A backing plate for absorbing incident light generated by a patterned light generator, the incident light being transmitted through a light sensitive coating and a transparent substrate onto the backing plate, the backing plate comprising a pair of polarizer sheets, each of which has a respective axis of polarization, the polarizer sheets being oriented so that more than 98% of light incident on the backing plate is absorbed, thereby causing the backing plate to absorb the incident light passing through the light sensitive coating and the transparent substrate.

6. A backing plate for absorbing incident light generated by a patterned light generator, the incident light being transmitted through a light sensitive coating and a transparent substrate onto the backing plate, the backing plate comprising a pair of polarizer sheets, each of which has a respective axis of polarization, the polarizer sheets being oriented so that less than 2% of light incident on the backing plate is reflected, thereby causing the backing plate to absorb the incident light passing through the light sensitive coating and the transparent substrate.

7. A photolithographic processing system, comprising:
    a transparent substrate with a light sensitive coating on a first side of the transparent substrate; and
    a backing plate positioned proximate to a second side of the transparent substrate, the second side being opposite to the first side, the backing plate comprising a pair of polarizer sheets, each of which has a respective axis of polarization, the polarizer sheets being oriented so that the axes of polarization of the polarizer sheets are oriented substantially orthogonal to each other, thereby causing the backing plate to absorb incident light generated by a patterned light generator, the incident light passing through the light sensitive coating and the transparent substrate.

8. The photolithographic processing system of claim 7 wherein the backing plate is in contact with the transparent substrate.

9. The photolithographic processing system of claim 8 wherein the backing plate supports the transparent substrate.

10. The photolithographic processing system of claim 7 wherein there is a gap between the backing plate and the transparent substrate.

11. The photolithographic processing system of claim 7, further comprising an index of refraction matching fluid coating on a surface of the backing plate facing the transparent substrate.

12. The photolithographic processing system of claim 7, further comprising an anti-glare coating covering a surface of the backing plate facing the transparent substrate.

13. The photolithographic processing system of claim 7 wherein the transparent substrate is index matched with the backing plate.

14. The photolithographic processing system of claim 7 wherein the patterned light generator is comprised of a mask and a light source.

15. The photolithographic processing system of claim 14 wherein the mask is comprised of a transparent material and an opaque pattern.

16. The photolithographic processing system of claim 7 wherein the patterned light generator is comprised of a projection printer.

17. The photolithographic processing system of claim 7 wherein the light sensitive coating is photoresist.

18. The photolithographic processing system of claim 7 wherein the polarizer sheets are in contact with each other.

19. The photolithographic processing system of claim 8 wherein the backing plate further comprises a vacuum chuck connected in airtight fashion to a vacuum source, the backing plate being held in contact with the transparent substrate by the vacuum chuck.

20. A method for producing a photolithographic exposure on a transparent substrate, comprising the steps of:
    depositing a light sensitive coating on a first surface of the transparent substrate;
    positioning a backing plate proximate to a second side of the transparent substrate, the second side being opposite to the first side, the backing plate comprising a pair of polarizer sheets, each of which has a respective axis of polarization, the polarizer sheets being oriented so that the axes of polarization of the polarizer sheets are oriented substantially orthogonal to each other, thereby causing the backing plate to absorb incident light passing through the light sensitive coating and the transparent substrate; and
    exposing the light sensitive coating to a pattern of incident light generated by a patterned light generator, the pattern of incident light passing through the light sensitive coating and the transparent substrate and being absorbed by the backing plate.

21. The met hod of claim 20 wherein the backing plate is in contact with the transparent substrate.

22. The method of claim 21 wherein the backing plate supports the transparent substrate.

23. The method of claim 20 wherein there is a gap between the backing plate and the transparent substrate.

24. The method of claim 20, further comprising an index of refraction matching fluid coating on a surface of the backing plate facing the transparent substrate.

25. The method of claim 20, further comprising an anti-glare coating covering a surface of the backing plate facing the transparent substrate.

26. The method of claim 20 wherein the transparent substrate is index matched with the backing plate.

27. The method of claim 20 wherein the patterned light generator is comprised of a mask and a light source.

28. The method of claim 27 wherein the mask is comprised of a transparent material and an opaque pattern.

29. The method of claim 20 wherein the patterned light generator is comprised of a projection printer.

30. The method of claim 20 wherein the light sensitive coating is photoresist.

31. The method of claim 20 wherein the polarizer sheets are in contact with each other.

32. The method of claim 21 wherein the backing plate further comprises a vacuum chuck, connected in airtight fashion to a vacuum source, the backing plate being held in contact with the transparent substrate by the vacuum chuck.

* * * * *